(12) United States Patent
Dean

(10) Patent No.: US 7,019,308 B2
(45) Date of Patent: Mar. 28, 2006

(54) THERMAL COMPENSATION IN MAGNETIC FIELD INFLUENCING OF AN ELECTRON BEAM

(75) Inventor: Andrew Dean, Stansted (GB)

(73) Assignee: Leica Microsystems Lithography Ltd., Cambridge (GB)

( * ) Notice: Subject to any disclaimer, the term of this patent is extended or adjusted under 35 U.S.C. 154(b) by 0 days.

(21) Appl. No.: 10/932,340

(22) Filed: Sep. 1, 2004

(65) Prior Publication Data

US 2006/0043311 A1    Mar. 2, 2006

(51) Int. Cl.
  H01J 37/147   (2006.01)
  H01J 37/141   (2006.01)
  G03F 7/20     (2006.01)
  H01L 21/027   (2006.01)

(52) U.S. Cl. .................. 250/396 ML; 250/396 R; 335/217; 335/210; 335/241; 335/246; 335/299

(58) Field of Classification Search ........ 250/396 ML, 250/396 R, 492.3; 335/209, 210, 213, 217, 335/241, 246, 299, 300
See application file for complete search history.

(56) References Cited

U.S. PATENT DOCUMENTS 5,338,939 A * 8/1994 Nishino et al. ...... 250/396 ML
5,382,800 A * 1/1995 Nishino et al. ...... 250/396 ML

FOREIGN PATENT DOCUMENTS

| JP | 05190428 | * | 7/1993 |
| JP | 6089850 A | | 3/1994 |
| JP | 6204127 A | | 7/1994 |
| JP | 05190428 | * | 8/2004 |

\* cited by examiner

*Primary Examiner*—John R. Lee
*Assistant Examiner*—Bernard E. Souw
(74) *Attorney, Agent, or Firm*—Houston Eliseeva LLP

(57) ABSTRACT

A device for influencing an electron beam, for example a beam deflecting device in an electron beam lithography machine, comprises a beam influencing coil (13) operable to influence an electron beam (EB) in the vicinity of the device by way of a magnetic field and a heat dissipation compensating coil (14) operable to provide a heat output so compensating for any change in heat dissipation of the device due to operation of the beam influencing coil (13)—particularly variable operation to vary the field intensity or to create and remove a field—as to reduce the amount of change, preferably to maintain the net heat dissipation at a constant value. The compensating coil (13) can be controlled, for example, by measurement (19) of the heat dissipation of the device and calculating (18) current supply (16) to the coil (13) in dependence on the measured dissipation.

27 Claims, 2 Drawing Sheets

THERMAL COMPENSATION IN MAGNETIC FIELD INFLUENCING OF AN ELECTRON BEAM

RELATED APPLICATIONS

Not applicable.

FIELD OF THE INVENTION

The present invention relates to a device for and a method of influencing an electron beam and especially refers to thermal stabilisation in connection with beam influencing by a magnetic field.

BACKGROUND OF THE INVENTION

Electrical coils for generating magnetic fields are widely used for, inter alia, influencing the path of an electron beam in an electron beam lithography machine, an electron microscope or other equipment generating and deploying electron beams for various purposes. Thus, for example, deflecting coils are used in lithography machines to provide controlled deflection of a beam with the object of writing a pattern, such as an integrated circuit format, on a substrate. Focussing coils are similarly used in lithography machines for focussing the beam to produce a desired writing beam spot on the substrate. The operation of such a coil results in ohmic heating of the coil wire and consequently an appreciable output of heat, which leads to expansion of the coil. Variable operation of the coil to generate and terminate the magnetic field and/or to vary the intensity of the field results in constant variation in the heat dissipation of the coil and consequently change in the dimensions of the coil, in particular of the coil winding and the former on which the winding is carried, as well as the magnetic field produced by the winding. Changes in the magnetic field detract from accuracy of beam spot placement on the substrate or in the sensitivity of the beam deflection or focussing and this in turn causes, for example increased tolerances in the pattern written by the beam.

In current practice, variations in the dimensions of the coil due to changes in heat dissipation are minimised by passive solutions, such as constructing the winding former and a potting medium of the winding from materials having low coefficients of thermal expansion, the former and the potting medium having the effect of constraining thermal expansion of the winding. This approach is effective within limits, but there remains scope for further improvement in thermal stabilisation in coils employed for generation of magnetic fields with sensitive control applications.

SUMMARY OF THE INVENTION

It is therefore the principal object of the invention to provide an enhanced degree of thermal stabilisation of a device incorporating a coil intended for use in influencing an electron beam by way of a magnetic field and thus an improvement in the stability of the sensitivity of the device.

Other objects and advantages of the invention will be apparent from the following description.

According to a first aspect of the present invention there is provided a device for influencing an electron beam, comprising a beam influencing coil operable to influence an electron beam in the vicinity of the device by way of a magnetic field and a heat dissipation compensating coil operable to provide a heat output so compensating for any change in heat dissipation of the device due to operation of the beam influencing coil as to at least reduce the amount of the change.

In the case of a device embodying the invention the heat output of the compensating coil—in effect an additional source of heat which may be able to be controlled—can serve to counterbalance changes in heat dissipation of the device as a whole and thus reduce or substantially entirely eliminate any change, in particular change caused by variable operation of the beam influencing coil. The resulting substantially constant, or at least more consistent, heat dissipation of the device leads to improved thermal stability of the device and its environment and thus less susceptibility to introduction of errors into the beam influencing, whether beam deflection or beam focussing, by the magnetic field.

In a preferred embodiment the compensating coil comprises two adjacent heat radiation windings connected to conduct current in respectively opposite directions, in which case the windings are preferably connected to conduct currents of substantially the same value. This arrangement avoids introduction of an additional magnetic field into the field produced by the beam influencing coil and thus, as a consequence, unintended influence on the beam by current flowing in the compensating coil.

In a convenient construction the compensating coil is disposed directly adjacent to the beam influencing coil. In that case, with advantage, the turns of the compensating coil are largely or entirely accommodated in voids formed at adjacent turns of the beam influencing coil. This possibility is offered by, for example, use of wire for the winding of the compensating coil which is considerably smaller in diameter than that of wire used for the winding of the beam influencing coil. Adjacent turns of the thicker wire of the latter coil winding create approximately V-shaped spaces in regions in which the circumferential surfaces of the adjacent turns depart from one another and thus result in voids potentially capable of accommodating smaller diameter wire of the winding of the compensating coil. Consequently, a device equipped with the compensating coil need not occupy any more volume or appreciably more volume than a standard, uncompensated device.

A significant advantage of the use of a heat dissipation compensating coil to provide a supplementary heat output with compensating effect is the scope for control of the heat output in various ways to optimise the compensation. Thus, in one preferred embodiment the device comprises control means for controlling operation of the compensating coil to provide a heat output maintaining the net heat dissipation of the device at a substantially constant value. The control means can be arranged to calculate the heat output of the compensating coil as a function of an operating parameter of the beam influencing coil. The parameter can be, for example, an operating feed current of the beam influencing coil, in which case the control means is arranged to determine the operating feed current for the beam influencing coil and to determine an operating feed current for the compensating coil as a function of the determined current for the beam influencing coil. As a result, the current required to operate the two coils can be calculated so that the net thermal dissipation of the coil remains constant regardless of the extent to which the electron beam is influenced by the beam influencing coil.

In an alternative solution, the control means can be arranged to measure the net heat dissipation of the device and to control operation of the compensating coil in dependence on the measured dissipation. In yet another solution, the control means can comprise a respective resistor in an operating current feed to each of the coils, the resistances of the resistors being in substantially the same ratio as the resistances of the coils, measuring means to measure the total heat dissipation of the resistors and means to so vary the operating current fed to the compensating coil as to maintain the total heat dissipation of the resistors at a substantially constant value.

It is also possible for the device to comprise control means for controlling operation of the compensating coil to provide a heat output changing inversely to change in net heat dissipation of the device. In that case, for example, the control means may comprise means for providing an electrical signal indicative of the net heat dissipation of the device, inverting the signal and controlling the compensating coil to provide a heat output dependent on the inverted signal. Heat compensation can thus be provided by opposite and equal reaction to any change in the net heat dissipation of the device resulting from variable operation of the beam influencing coil.

In terms of variable operation, the beam influencing coil can, for example, be operable to generate the magnetic field at discrete intervals and/or controllable to vary the intensity of the magnetic field, thus energisation/de-energisation of the beam influencing coil and/or variation in the level of current supply to that coil. This beam influencing coil can be used, as already indicated, for deflecting the beam by way of the magnetic field or for focussing the beam.

In a preferred construction the device comprises an even number of such beam influencing coils disposed symmetrically around a given path of the beam and a respective such compensating coil associated with each beam influencing coil. Typically, in the case of a device for deflecting a beam two pairs of diametrically opposite coils are present, each pair of coils being arranged substantially symmetrically with respect to a respective one of two planes at right angles to each other.

According to a second aspect of the invention there is provided a method of influencing an electron beam, comprising the steps of influencing the beam by a magnetic field generated by a beam influencing coil and providing supplementary heat to so compensate for any change in heat dissipation of the coil due to the magnetic field as to at least reduce the amount of the change.

In one preferred example of the method the step of providing the supplementary heat comprises conducting current in respectively opposite directions through two adjacent heat radiation windings distinct from the coil, in which case the currents conducted in these windings are, for preference, of substantially the same value.

In similar manner to the first aspect of the invention, the method can include a step of controlling the supplementary heat to maintain the net heat dissipation of the coil generating the magnetic field at a substantially constant value, in which case the supplementary heat can, for example, be calculated in dependence on a parameter of generation of the magnetic field. This parameter is preferably a current for use in generating the magnetic field and the step of calculating preferably comprises determining that current and determining, as a function of the determined current, a further current for use in providing the supplementary heat. As an alternative to calculation of the supplementary heat, the method can comprise the step of measuring the net heat dissipation of the coil and controlling provision of the supplementary heat in dependence on the measured dissipation.

In the case of another proposed control procedure, the method comprises the step of controlling the supplementary heat to change inversely to change in net heat dissipation of the coil. This can be conveniently achieved by providing an electrical signal indicative of the net heat dissipation of the coil, inverting the signal and controlling provision of the supplementary heat in dependence on the inverted signal.

BRIEF DESCRIPTION OF THE DRAWINGS

Examples of the method and embodiments of the coil will now be more particularly described with reference to the accompanying drawings, in which.

DETAILED DESCRIPTION OF THE INVENTION

Figure 1:
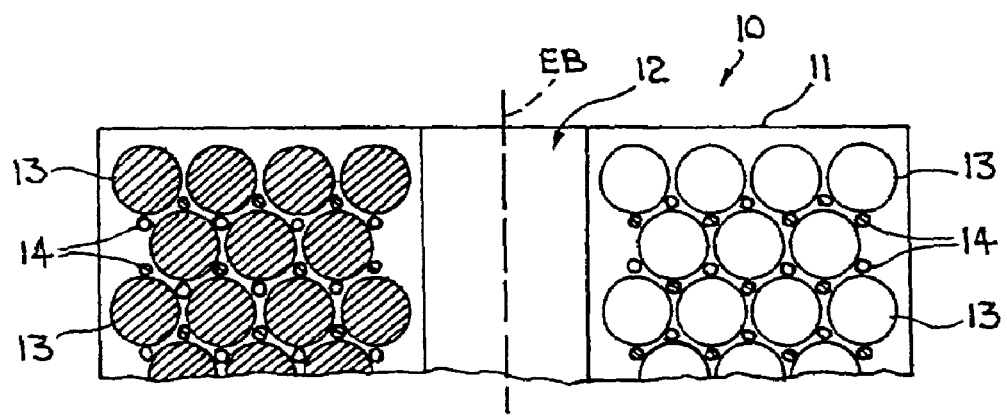
FIG. 1 is a schematic sectional elevation of part of a deflecting device embodying the invention, showing one possible relationship of coils of the device.

Referring now to the drawings there is shown in FIG. 1 part of a device 10 for influencing an electron beam 11, for example a device for deflecting an electron beam in a pattern-writing machine to enable scanning of a substrate surface for the purpose of writing an integrated circuit or other desired pattern on the surface. Devices for such a use commonly consist of pairs of diametrically opposite coils disposed on either side of the beam path and each operable to generate a magnetic field, the opposed coils of each pair being controlled in opposite sense so that as field intensity is increased on one side it is decreased on the other to cause deflection of the beam in the direction of the stronger field. Through provision of two pairs of coils arranged so that the coils of each pair are symmetrical with respect to an individual one of two mutually orthogonal planes it is possible, with appropriate control of the four coils, to deflect the beam out of its normal path in any desired radial direction.

A beam deflecting device 10 of such a kind conventionally comprises, as indicated in FIG. 1, a coil former 11 in form of a cylindrical body of electrically insulating material having a low coefficient of thermal expansion. The cylindrical body of the former 11 defines an axial bore 12 for passage of an electron beam EB, which is emitted by an electron gun at the top of an electron column in which the device 10 is fitted. The coil former 11 carries beam deflecting coils 13 (only one is shown in FIG. 1) positioned and operated as described in the preceding paragraph. Operation of the coils by supplied electrical current to generate the magnetic fields also results in generation of a considerable amount of waste heat to be dissipated by the device. Notwithstanding selection of the constituent material of the former 11 and also an embedding mass for the coils 13 to have low coefficients of thermal expansion, the former and the wires of the coil windings experience constant changes in dimension due to thermal expansion and contraction resulting from both switching the coils on and off and controlling the coils in variable manner to change the intensities of the magnetic fields. Such dimensional changes induce changes in the field dimensions and thereby impair the sensitivity of the beam deflection and thus the accuracy of pattern writing by the beam.

In order to oppose and preferably substantially entirely eliminate such dimensional changes by regulation of the heat dissipation of the device to a constant value, an additional heat output is provided to compensate for changes occasioned by the on/off switching and variable operation of the beam influencing coils 13. For this purpose the device 10 additionally includes a respective heat dissipation compensating coil 14 associated with each beam deflecting coil 13, the compensating coils 14 (only one is shown in FIG. 1) being operated to provide a supplementary heat output leading to constant thermal dissipation of the device.

As depicted in FIG. 1, each compensating coil 14 can consist of a winding of wire of significantly smaller diameter than that of wire employed for the winding of each deflecting coil 13. As a result, the winding of the coil 14 can be accommodated in voids between adjacent turns of the winding of the coil 13, in particular in the gaps formed in the regions where the circumferential surfaces of the circular-section wire of the latter winding depart from one another. Consequently, provision of the compensating coils 14 is not necessarily accompanied by any increase in the volume of the former 11 inclusive of wound and embedded deflecting coils 13. FIG. 1 also shows a preferred orientation of the direction of current flow in the compensating coil 14 in relation to that in the deflecting coil 13, the hatched sections denoting flow towards and empty sections flow away from the viewer.

Figure 2:
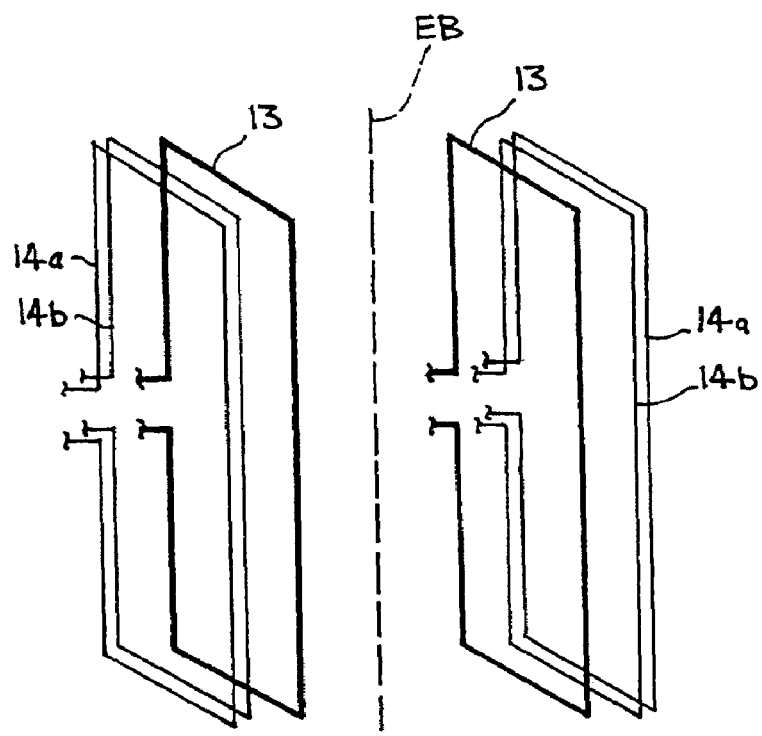
FIG. 2 is a diagram showing the relative disposition of coils in such a device in the case of a multi-winding coil and a single-winding coil.

Any undesired contribution to the magnetic fields of the deflecting coils 13 by magnetic fields induced by the compensating coils 14 may be able to be eliminated by a bifilar coil construction as shown in FIG. 2. In this embodiment the compensating coil comprises two parallelly extending and closely adjacent windings 14a and 14b each conducting current in a respective one of two opposite directions. This largely avoids generation of a magnetic field by the compensating coil windings 14a, 14b so that there is no addition to the net magnetic field of the adjacently disposed winding of the deflecting coil 13.

Appropriate control of the compensating coils 14 to provide a supplementary heat output compensating for change in the heat dissipation of the device 10 can be provided by a number of different procedures, depending on whether the compensation is based directly on maintaining a constant value of the net heat dissipation or an inverse reaction to change in the dissipation.

Figure 3:
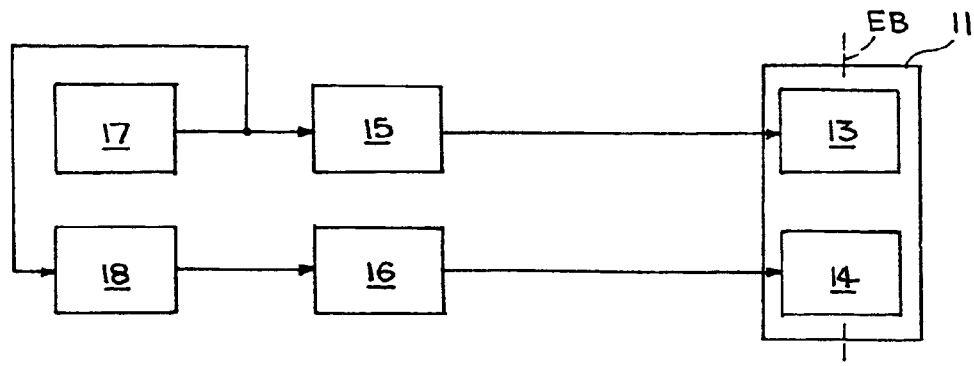
FIGS. 3, 4 and 5 are schematic circuit diagrams of a deflecting device embodying the invention, showing, respectively, three different bases of control of coils of the device.
Figure 4:
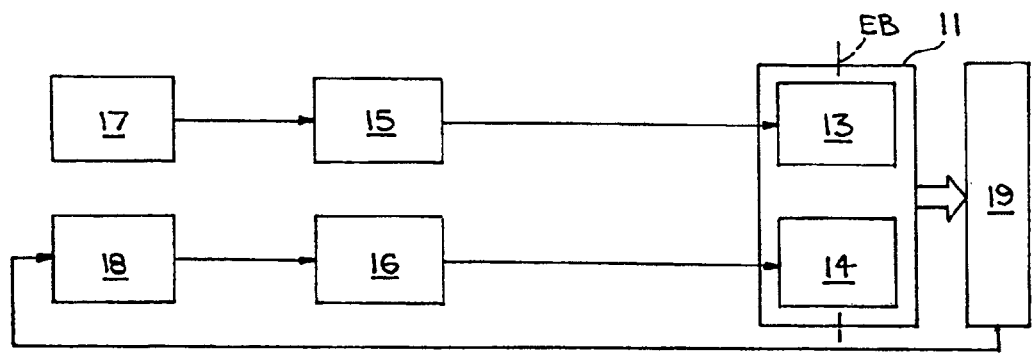
Figure 5:
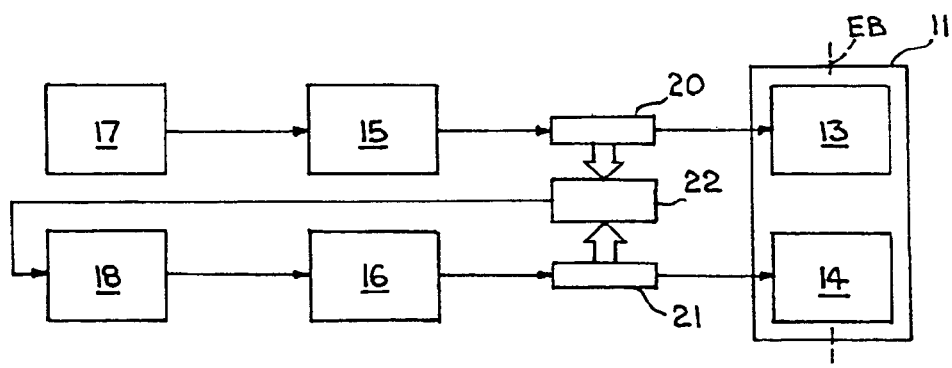

Control circuits for three such procedures are schematically illustrated in FIGS. 3, 4 and 5, each of which depicts the coil former 11 carrying, by way of example, a single one of the beam deflecting coils 13 and an associated one of the heat dissipation compensating coils 14. Operating current for operating the coil 13 is supplied from a first current supply source 15 and current for operating the coil 14 from a second supply source 16. The level of current supplied from the first source 15 is determined by a first calculating stage 17, which calculates a value of operating current supply to the deflecting coil 13 in order to produce, by way of the magnetic field generated by the coil, the instantaneously required degree of deflection of the electron beam. The degree of deflection can vary between zero and a predetermined maximum angle and the current supply valve can correspondingly vary between zero and a predetermined maximum value. The level of current supply from the second source 16 is determined by a second calculating stage 18, which calculates a value of operating current supply to the compensating coil 14 in order to provide a supplementary heat output compensating for the variation in heat output of the coil 13 and thus for the variation in net heat dissipation of the device.

In the case of the specific circuit of FIG. 3, the second stage 18 is responsive to, and calculates the current supply value for the coil 14 in dependence on, the current supply value calculated by the first stage 17. The change in heat dissipation of the device including the coil former 11 and coils 13 and 14 can be empirically established so that the amount of supplementary heat required from the compensating coil 14 in order to keep the net heat dissipation of the device substantially constant is known and can be utilised as a basis for calculation of the current supply value for the coil 14 by the second stage 18. The usually required high rate of deflection of the electron beam necessitates rapid adjustment of the magnetic field produced by the deflecting coil 13 and consequently rapid adjustment of the heat output of the compensating coil 14. The current supply value calculation can be conveniently performed by a control computer of the machine incorporating the deflecting device, in which case the calculating stages 17 and 18 can be embodied as software of the computer.

In the case of the control circuit shown in FIG. 4 a measuring unit 19 is present to measure the net heat dissipation of the device incorporating the coil former 11 and coils 13 and 14. A measurement signal indicative of the measured net heat dissipation is applied by the measuring unit 19 to the second calculating stage 18, which calculates the operating current supply value for the compensating coil 14 in dependence on the value of the input measurement signal. In this instance, the measurement signal can be inverted and amplified before application to the stage 18, so that the stage calculates an operating current supply value based on the inverse of any change in the net heat dissipation of the device.

Finally, in the control circuit shown in FIG. 5 the two current sources 15 and 16 are connected in series with, respectively, resistors 20 and 21 in the feed paths to the coils 13 and 14. The resistors 20 and 21 have resistances in the same ratio to one another as the resistances of the windings of the coils 13 and 14. Associated with the resistors 20 and 21 is a measuring unit 22 for measuring the net heat dissipation of the resistors and for applying a measurement signal indicative of the measured heat dissipation of the resistors to the second calculating stage 18. The stage 18 then calculates an operating current supply value for the compensating coil 14 as a function of the input measurement signal value, in particular an operating current supply resulting in compensation for change in net heat dissipation of the resistors in such a manner that this dissipation remains substantially constant. Since the resistances of the resistors are in the same ratio as the resistances of the coil windings, it follows that the heat output of the compensating coil 14 will be such as to maintain the net heat dissipation of the device containing the former 11 and coils 13 at a substantially constant value.

Although the embodiments of the beam influencing device and examples of methods of influencing a beam have been described with reference to beam deflection, the invention is equally applicable to influencing the beam in the sense of focussing or in any other manner in which the beam responds to an electrically generated magnetic field. The provision of a supplementary heat output to compensate for change in heat dissipation of the coil, whether to eliminate change or to significantly reduce change, contributes to the stability of the device in operation and may reduce errors, for example pattern-writing tolerances, attributable to thermal instability of the device.

What is claimed is:

1. A device for influencing an electron beam, comprising:
   a beam influencing coil having a beam influencing coil turns and operable to influence an electron beam by way of a magnetic field; and
   a heat dissipation compensating coil having compensating coil turns operable to provide a heat output so compensating for any change in heat dissipation of the device due to operation of the beam influencing coil as to at least reduce the amount of the change, wherein the compensating coil turns are disposed in the voids formed by adjacent beam influencing coil turns.

2. The device as claimed in claim 1, wherein the compensating coil comprises two adjacent heat radiation windings connected to conduct current in respectively opposite directions.

3. The device as claimed in claim 2, wherein the windings are connected to conduct currents of substantially the same value.

4. The device as claimed in claim 1, wherein a control means for controlling operation of the compensating coil to provide a heat output applied to maintain the net heat dissipation of the device at a substantially constant value.

5. The device as claimed in claim 4, wherein the control means is arranged to calculate the heat output of the compensating coil as a function of an operating parameter of the beam influencing coil.

6. The device as claimed in claim 5, wherein the parameter is an operating feed current of the beam influencing coil, the control means being arranged to determine the operating feed current for the beam influencing coil and to determine an operating feed current for the compensating coil as a function of the determined current for the bean influencing coil.

7. The device as claimed in claim 4, wherein the control means is arranged to measure the net heat dissipation of the device and to control operation of the compensating coil in dependence on the measured dissipation.

8. The device as claimed in claim 4, wherein the control means comprises a respective resistor in an operating current feed to each of the coils, the resistances of the resistors being in substantially the same ratio as the resistances of the coils, measuring means to measure the total heat dissipation of the resistors and means to so vary the operating current fed to the compensating coil as to maintain the total heat dissipation of the resistors at a substantially constant value.

9. The device as claimed in claim 1, wherein a control means for controlling operation of the compensating coil to provide a heat output is applied to change inversely to change in net heat dissipation of the device.

10. The device as claimed in claim 9, wherein the control means comprises means for providing an electrical signal indicative of the net heat dissipation of the device, inverting the signal and controlling the compensating coil to provide a heat output dependent on the inverted signal.

11. The device as claimed in claim 1, wherein the beam influencing coil is operable to generate the magnetic field at discrete intervals.

12. The device as claimed in claim 1, wherein the beam influencing coil is controllable to vary the intensity of the magnetic field.

13. The device as claimed in claim 1, wherein the beam influencing coil is operable to deflect the beam by way of the magnetic field.

14. The device as claimed in claim 1, wherein the beam influencing coil is operable to focus the beam by way of the magnetic field.

15. The device as claimed in claim 1, comprising an even number of such beam influencing coils disposed substantially symmetrically around a given path of the beam and a respective such compensating coil associated with each beam influencing coil.

16. A method of influencing an electron beam, comprising the steps of:
   generating a magnetic field by a beam influencing coil having a beam influencing coil turns;
   providing a heat dissipation compensating coil in a form of two adjacent windings having compensating coil turns disposed in the voids formed by adjacent beam influencing coil turns;
   providing supplementary heat by conducting current through the two adjacent radiation windings in opposite directions; and
   influencing the beam by a magnetic field generated by the beam influencing coil.

17. The method as claimed in claim 16, wherein the currents conducted in the windings are of substantially the same value.

18. The method as claimed in claim 16, comprising the step of controlling the supplementary heat to maintain the net heat dissipation of the coil at a substantially constant value.

19. The method as claimed in claim 18, comprising the step of calculating the supplementary heat in dependence on a parameter of generation of the magnetic field.

20. The method as claimed in claim 19, wherein the parameter is a current for use in generating the magnetic field and the step of calculating comprises determining that current and determining, as a function of the determined current, a further current for use in providing the supplementary heat.

21. The method as claimed in claim 18, comprising the step of measuring the net heat dissipation of the coil and controlling provision of the supplementary heat in dependence on the measured dissipation.

22. The method as claimed in claim 16, comprising the step of controlling the supplementary heat to change inversely to change in net heat dissipation of the coil.

23. The method as claimed in claim 22, comprising the step of providing an electrical signal indicative of the net heat dissipation of the coil, inverting the signal and controlling provision of the supplementary heat in dependence on the inverted signal.

24. The method as claimed in claim 16, comprising the step of generating the magnetic field at discrete intervals.

25. The method as claimed in claim 16, comprising the step of varying the intensity of the magnetic field.

26. The method as claimed in claim 16, comprising the step of deflecting the beam by way of the magnetic field.

27. The method as claimed in claim 16, comprising the step of focusing the beam by way of the magnetic field.

* * * * *